US006381563B1

(12) United States Patent
O'Riordan et al.

(10) Patent No.: US 6,381,563 B1
(45) Date of Patent: Apr. 30, 2002

(54) SYSTEM AND METHOD FOR SIMULATING CIRCUITS USING INLINE SUBCIRCUITS

(75) Inventors: Donald J. O'Riordan, Sunnyvale; Walter J. Ghijsen, Los Gatos; Kenneth S. Kundert, Los Altos, all of CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/236,196

(22) Filed: Jan. 22, 1999

(51) Int. Cl.[7] .......................... G06F 9/455; G06F 17/50
(52) U.S. Cl. ............................................ 703/14; 716/5
(58) Field of Search .......................... 703/14–19; 716/4, 716/5

(56) References Cited

U.S. PATENT DOCUMENTS

| | | | | |
|---|---|---|---|---|
| 5,671,399 A | * | 9/1997 | Meier | 716/5 |
| 5,808,896 A | * | 9/1998 | Weber | 703/18 |
| 5,946,218 A | * | 8/1999 | Taylor et al. | 703/15 |
| 6,053,947 A | * | 4/2000 | Parson | 703/14 |
| 6,068,663 A | * | 5/2000 | Ura | 716/11 |
| 6,134,513 A | * | 10/2000 | Gopal | 703/14 |
| 6,175,949 B1 | * | 1/2001 | Gristede et al. | 716/11 |

OTHER PUBLICATIONS

Song et al., "A Simulation Efficiency Improvement Method for Simulation–Based Analog Cell Synthesis", First IEEE Asia Pacific Conf. on ASICs, pp. 225–228, Aug. 1999.*
Overhauser et al., "A Tabular Macromodeling Approach to Fast Timing Simulation Including Parasitics", IEEE International Conference on Computer–Aided Design, pp. 70–73, Nov. 1988.*
Chowdhary et al., "Extraction of Functional Regularity in Datapath Circuits", IEEE Transactions on Compter–Aided Design of Integrated Circuits, vol. 18, Issue 9, pp. 1279–1296, Sep. 1999.*
Chakrabarti et al., "An Improved Test Generation Technique for Combinations Circuits with Repetavie Sub–Circuits", Proc. of the 4th Asian Test Symposium, 1995, pp. 237–243.*
Kim et al., "Hierarchical LVS Based Hierarchy Rebuilding", Proc. of the ASP–DAC Design Automation Conference, pp. 379–384, Feb. 1998.*
Eckmuller et al., "Hierarchical Characterization of Analog Integrated CMOS Circuits", Proc. Design, Automation and Test in Europe, pp. 636–643, Feb. 1998.*
Tan et al., "Balanced Multi–Level Muti–way Partioning of Large Analog Circuits for Hierarchical Symbolic Analysis", Proc. of the ASP–DAC Design Automation Conference, vol. 1, pp. 1–4, Jan. 1999.*

* cited by examiner

Primary Examiner—Russell W. Frejd
(74) Attorney, Agent, or Firm—Lyon & Lyon LLP

(57) ABSTRACT

A system and method for generating inline subcircuits that enable a circuit designer to model and simulate circuits that when compared to conventional system and methods reduces the hierarchy from the perspective of the circuit designer, more efficiently models parasitic components, more efficiently parameterizes device models, more effectively creates models that are compatible with other simulation tools, can change the interface of a component without requiring the designer to use an extra layer of hierarchy, provides a more efficient interface by hiding details from the designer, enables hidden monitors and other functional designs to be automatically simulated by hiding these functions from the designer in a design level that is below the design level that is of interest to the designer, such as the geometrical parameter design level, can perform general purpose model binning with automatic selection, can export models and model parameters to other hierarchies without requiring an additional hierarchy in the model name, can allow sharing of exported parameterized models by devices or components that are not within the inline subcircuit definition and can modify or create outputs for models by redefining or hiding existing outputs or creating new outputs.

47 Claims, 2 Drawing Sheets

SYSTEM AND METHOD FOR SIMULATING CIRCUITS USING INLINE SUBCIRCUITS

BACKGROUND OF THE INVENTION

1. Field of the Invention

The present invention relates to the field of computer simulators and more precisely to the field of analog, digital and mixed-signal circuit simulation and modeling.

2. Description of Background Art

Designers of electronic circuits frequently use various techniques to test and modify their designs. One conventional technique is to use computer software to create a circuit design by placing electronic representations of components (component models) in their design. After completing a first design, the design can be simulated to ensure proper functionality. One benefit of simulating circuits before manufacturing is to ensure the circuit functions properly in response to many potential input signals and in a wide variety of operating environments, for example. By identifying and correcting design errors before manufacturing the circuit, a significant savings in terms of both time and expense is achieved.

When modeling and simulating circuits, e.g., analog, digital, or mixed signal circuits, designers attempt to meticulously model the design components, e.g., transistors, resistors, and capacitors, in order to account for the non-ideal nature of the components. For example, in order to more accurately model components, intrinsic capacitances and resistances should be included. Designers also use a hierarchical structure to more efficiently design a circuit. This permits a single element, or a group of elements to be described as a subcircuit, for example, which can be used many times but whose definition need only be stored in memory once. Another benefit of using hierarchical structures is that it presents a more abstract view at any hierarchical level, allowing the designer to concentrate on the interface at that level, without worrying about the detail which is at a lower level.

FIG. 1 is an illustration of a filter subcircuit that can be used in designing circuits. The filter subcircuit definition is denoted as S1 and is defined as part of a second level of the design hierarchy. The filter subcircuit S1 includes a resistor R1 and a capacitor C1 combined in the orientation illustrated in FIG. 1. The resistor R1 and capacitor C1 are defined in a first level of the design hierarchy. In order to simplify the design process, the designer can use the filter subcircuit instead of the lower level components, e.g., R1 and C1. This simplifies the design and decreases memory requirements since R1 and C1 need only be stored once and one or more references to the subcircuit in the second level will reference these components. For example, subcircuit S1 may be defined in a design language, such as SPICE, as

.SUBCKT S1 A B

R1 A B 1K

C1 B 0 1U

.ENDS where the subcircuit definition name or label is S1, and it is defined as including (1) a resistor labeled R1 that is located between nodes A and B and (2) a capacitor labeled C1 that is located between node B and ground (0). Additional elements or modeling can be included and would be apparent to persons skilled in the art. Additional details regarding the operation of SPICE are described in R. Kielkowski SPICE, Practical Device Modeling, McGraw-Hill (1995), which is incorporated by reference herein in its entirety.

FIG. 2 is an illustration of a hierarchical circuit design using three instances of (references to) filter subcircuits. In some hierarchical design systems, a subcircuit label, e.g., X2, can only be used once at each level of the hierarchy. However the same label, tag, or name can be used at different hierarchical levels. In FIG. 2, different subcircuit instances are labeled with different names. Three second level subcircuit instances, X1, X2, and X3 are all defined to be of a type S1, as illustrated in FIG. 1. These second level subcircuits are in hierarchical level 2 and are serially combined to form a third level subcircuit that is labeled S2. The S2 subcircuit could be defined as:

.SUBCKT S2 in out

X1 in A S1

X2 A B S1

X3 B out S1

.ENDS where subcircuit S2 is defined as including (1) an instance X1 that is located between the input (in) and node A and is a subcircuit as defined by S1 at the previous hierarchical level, (2) another instance of a subcircuit of the type S1 that is labeled X2 and is located between nodes A and B, and (3) a third instance of a subcircuit of the type S1 that is located between nodes B and out. In some hierarchical design systems, a subcircuit instance label must begin with the letter "X" (or "x"), though this is not true of all hierarchical design systems and is not required for the present invention. For ease of discussion, in this section subcircuits instance labels will begin with "X".

FIG. 3a is an illustration of a circuit design at the third hierarchical level. FIG. 3b is an illustration of a circuit design of FIG. 3a at the first hierarchical level. In order to design a circuit having six filters a designer who has access to subcircuit S2 in the third hierarchical level can design the circuit merely by placing two subcircuit instances X1 and X2 that are defined to be of an S2 subcircuit type as illustrated in FIG. 3a. The circuit illustrated in FIG. 3a is equivalent to the circuit illustrated in FIG. 3b. However, by using subcircuits and hierarchical design techniques, the designer can focus on the high level functions instead of the lower level details. The code representing FIG. 3a can be:

X1 in A S2

X2 A out S2 where X1 is a subcircuit of the type S2 (in the previous hierarchical level) and is located between nodes "in" and "A". X2 is also a subcircuit of the type S2 and is located between nodes "A" and "out".

A problem with conventional hierarchical designs is that while a designer can design at various hierarchical levels to avoid implementation details, when the designer wants to test the design by simulating it, the designer must address the implementation details. In the above example, in order to identify the current through the third resistor in the first hierarchical level, i.e., Ixy in FIG. 3b, the designer must know where the resistor is in the hierarchy and must identify each hierarchical level in order to determine the simulated element, e.g., the current through resistor X1.X3.R1. Accordingly, in order to save the current through the third resistor of FIG. 3b during simulation the designer must program the following statement (given in Spectre circuit simulator syntax, Spectre is commercially available from Cadence Design Systems, Inc., San Jose, Calif.):

save X1.X3.R1:i which identifies subcircuit X1 in the third hierarchical level, then identifies subcircuit X3 in the second hierarchical level and then identifies R1 in the first hierarchical level before requesting the current (i) through the resistor be saved, see FIGS. 1, 2, and 3a.

Subcircuit definitions can also contain parasitic components. Subcircuit definitions can be parameterized, and include models, and the subcircuit parameters can be referenced in expressions in the models and/or parasitic components, for example.

In addition, a problem with conventional models is that the output parameters are predefined. Currently, a designer has no efficient technique for modifying the output parameters of the models.

What is needed is a system and method for modeling and simulating circuits that (1) reduces the hierarchy from the perspective of the circuit designer; (2) more efficiently models parasitic components; (3) more efficiently parameterizes device models; (4) more effectively creates models that are compatible with other simulation tools; (5) can change the interface of a component without requiring the designer to use an extra layer of hierarchy; (6) provides a more efficient interface by hiding details from the designer; (7) enables hidden monitors and other functional designs to be automatically simulated by hiding these functions from the designer in a design level that is below the design level that is of interest to the designer, such as the geometrical parameter design level; (8) can perform general purpose model binning with automatic selection; (9) can export models and model parameters to other hierarchies without requiring an additional hierarchy in the model name; (10) can allow sharing of exported parameterized models by devices or components that are not within the inline subcircuit definition and (11) can modify or create outputs for models by redefining or hiding existing outputs or creating new outputs.

SUMMARY OF THE INVENTION

The invention is a system and method for generating inline subcircuits that enable a circuit designer to model and simulate circuits that when compared to conventional system and methods reduces the hierarchy from the perspective of the circuit designer, more efficiently models parasitic components, more efficiently parameterizes device models, more effectively creates models that are compatible with other simulation tools, can change the interface of a component without requiring the designer to use an extra layer of hierarchy, provides a more efficient interface by hiding details from the designer, enables hidden monitors and other functional designs to be automatically simulated by hiding these functions from the designer in a design level that is below the design level that is of interest to the designer, such as the geometrical parameter design level, can perform general purpose model binning with automatic selection, can export models and model parameters to other hierarchies without requiring an additional hierarchy in the model name, can allow sharing of exported parameterized models by devices or components that are not within the inline subcircuit definition and can modify or create outputs for models by redefining or hiding existing outputs or creating new outputs.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used.

Figure 1:
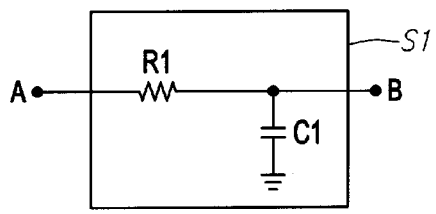
FIG. 1 is an illustration of a filter subcircuit that can be used in designing circuits.
Figure 2:
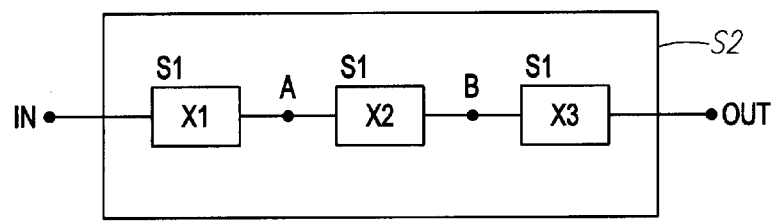
FIG. 2 is an illustration of a hierarchical circuit design using three filter subcircuits.
Figure 3A:
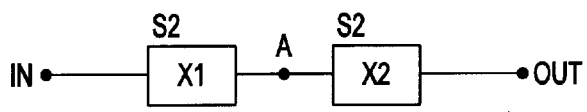
FIG. 3a is an illustration of a circuit design at the third hierarchical level.
Figure 3B:
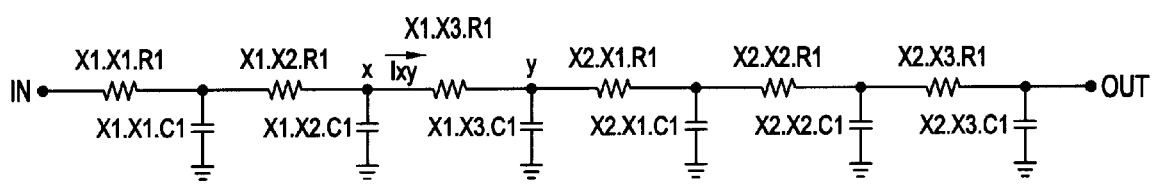
FIG. 3b is an illustration of a circuit design at the first hierarchical level.
Figure 4:
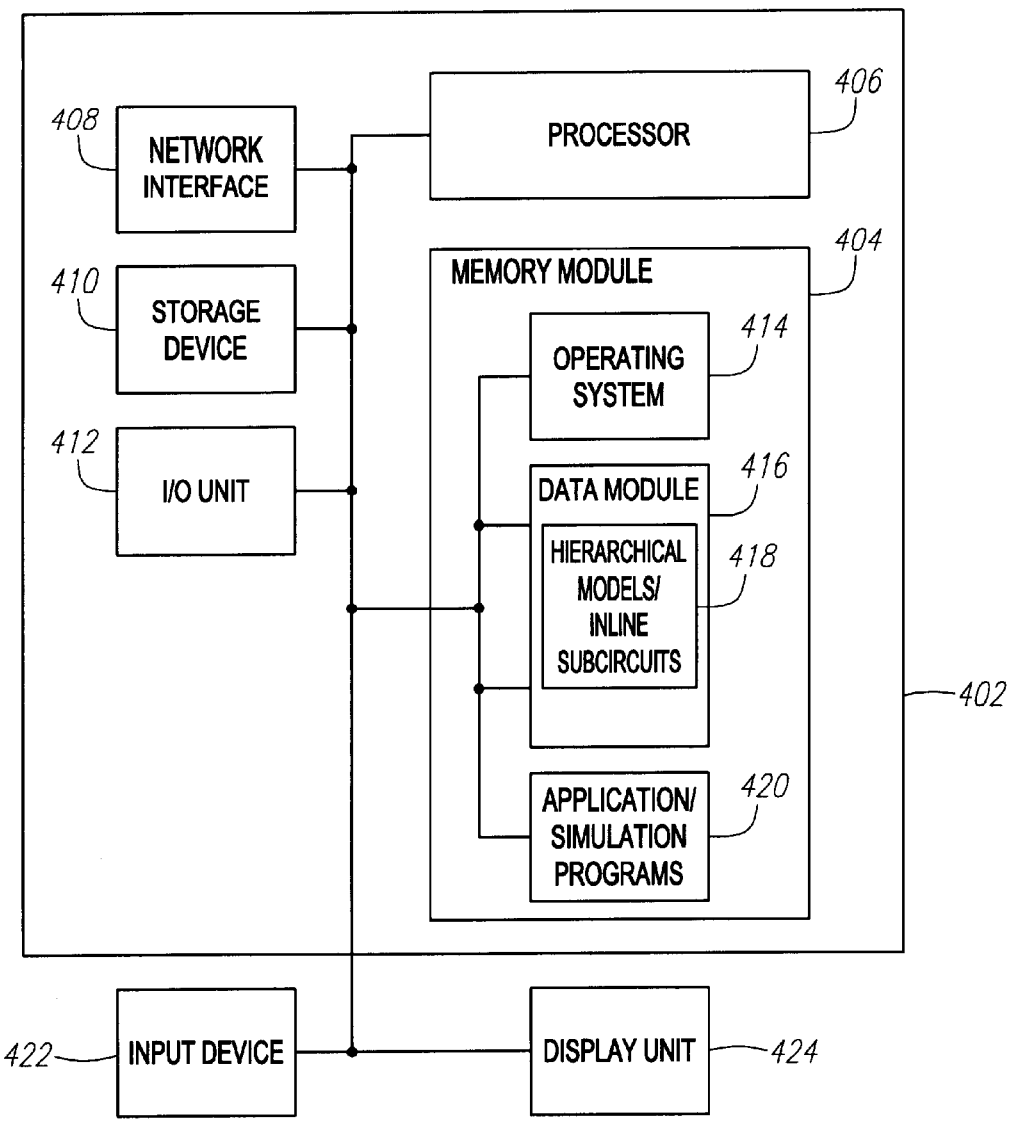
FIG. 4 is an illustration of a computer system in which the preferred embodiment of the present invention resides and operates.

FIG. 4 is an illustration of a computer system in which the preferred embodiment of the present invention resides and operates. The computer system includes a conventional computer 402, such as a SPARC Station 10 commercially available from Sun Microsystems, Santa Clara, Calif. or an IBM compatible personal computer, e.g., commercially available from IBM Corp., Armonk, N.Y. The computer 402 includes a memory module 404, a processor 406, an optional network interface 408, a storage device 410, and an input/output (I/O) unit 412. In addition, an input device 422 and a display unit 424 can be coupled to the computer. The memory module can be conventional random access memory (RAM) and can include a conventional operating system 414, a data module 416 for storing data and data structure generated by the present invention, e.g., inline subcircuits, a hierarchical models/inline subcircuits module 418, the operation of which is described in greater detail below, and application programs 420, for example, the Cadence Spectre analog circuit simulation program, that is commercially available from Cadence Design Systems, San Jose, Calif. Although the preferred embodiment of the present invention is described with respect to an analog circuit simulator in a computer aided design (CAD) environment, it will be apparent to persons skilled in the art that the system and method of the present invention can be utilized in many different environments or types of circuit simulators, e.g., timing simulators, mixed signal simulators, logic simulators, etc., without departing from the scope of the present invention.

The processor 406 can be a conventional microprocessor, e.g., a Pentium II processor commercially available from Intel Corporation, Santa Clara, Calif. The optional network interface 408, the storage device 410, and the I/O unit are all conventional. The input device 422 can be a conventional keyboard that is commercially available from Hewlett Packard, Palo Alto, Calif. , or mouse, for example, that is commercially available from Logitech Incorporated, Freemont, Calif. The display unit 424 can be a conventional display monitor that is commercially available from IBM Corporation.

For clarity, the following description of the present invention does not describe the invention at the electronic signal manipulation level of detail. However, it will be apparent to persons skilled in the art that the steps such as storing a value, for example, correspond to manipulating a signal representing the value and storing the signal in the data module 416 or the storage device 410, for example. It will also be apparent to persons skilled in the art that the data module 416 may be any type of memory or combinations thereof, for example, RAM and/or cache, and that the hierarchical modules/inline subcircuits module 418 can be stored directly in the data module 416 or can be stored in the storage device 410, e.g., a hard disk drive or any computer readable medium, for example.

Figure 5:
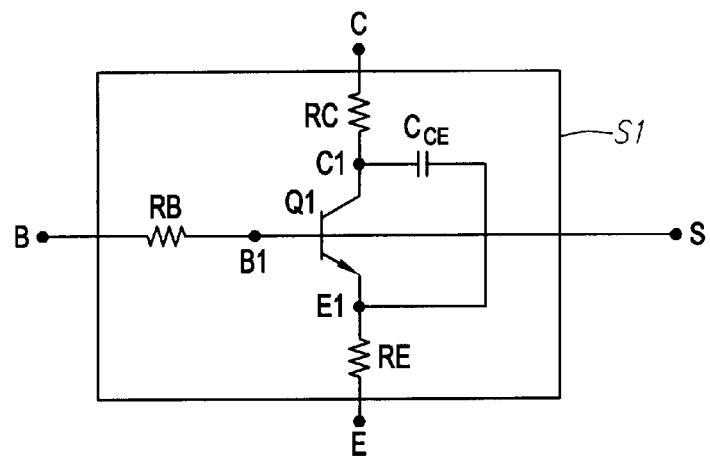
FIG. 5 is an illustration of a component having parasitic resistances and capacitances modeled therein that can be represented by an inline subcircuit according to the present invention.

FIG. 5 is an illustration of a component having parasitic resistances and capacitances modeled therein that can be represented by an inline subcircuit according to the present invention. Other types of parasitic components can also be modeled such as parasitic transistors, for example. The component illustrated is a bipolar junction transistor Q1 having four terminals, a collector terminal (C), a base terminal (B), an emitter terminal (E), and a substrate terminal (S). As indicated above, in order to properly model circuit components, non-ideal characteristics should be included in the model. In the example illustrated in FIG. 5, the transistor model includes parasitic resistances, RC, RB, and RE and parasitic capacitance $C_{CE}$. However, as described above, it is preferable for circuit designers to have such non-ideal characteristics modeled automatically. A conventional subcircuit could be used to model components, e.g., transistor Q1, but the circuit designer must still keep track of the low level components and each hierarchical level in order to properly save and examine the simulation results for the component, as described herein.

The present invention solves many of the problems associated with the use of conventional subcircuits. In the present invention a component can be defined as an inline subcircuit having components in lower hierarchy where at least one component is defined as the inline component and is accessible directly from higher hierarchical levels. Benefits of the present invention include (1) reducing the hierarchy from the perspective of the circuit designer; (2) more efficiently modeling parasitic components;(3) more efficiently parameterizing device models; (4) more effectively creating models that are compatible with other simulation tools; (5) altering the interface of a component without requiring the designer to use an extra layer of hierarchy; (6) providing a more efficient interface by hiding details from the designer; (7) enabling hidden monitors and other functional designs to be automatically simulated by hiding these functions from the designer in a design level that is below the design level that is of interest to the designer, such as the geometrical parameter design level; (8) performing general purpose model binning with automatic selection; (9) exporting models and model parameters to other hierarchies without requiring an additional hierarchy in the model name; (10) sharing of exported parameterized models by devices or components that are not within the inline subcircuit definition, and (11) modifying or creating outputs for models by redefining or hiding existing outputs or creating new outputs.

An inline subcircuit of the transistor illustrated in FIG. 5 can be defined as shown in example (1) where the Spectre syntax is used in the remaining examples, it will be apparent that any syntax can be used without departing from the present invention.

```
INLINE SUBCKT s1(c1 b1 e1 s)
parameters le=5u we=5u area=le*we
model mod1 bjt type=npn bf=100+(le+we)/2*(area/le-
    12)
s1 (c b e s) mod1
rc c c1 resistor r=10*area*le13
rb b b1 resistor r=20*area*le11
re e e1 resistor r=25*area*le12
ENDS s1
```

EXAMPLE (1)

The name of the inline subcircuit is "s1" and includes 4 terminals (c, b, e, and s) and three parameters (le, we, and area). In this example, the parameters represent the geometry of the device where the default length (le) and width (we) of the transistor are each 5 microns (u) and the area is equal to the length multiplied by the width. A model labeled "mod1" is also included in the inline subcircuit definition. As discussed below, it is possible for models to be their own separate inline subcircuit. In the above example, the model is a bipolar junction transistor (bjt) of an "npn" type having a current gain (bf) equal to 100+(le+we)/2*(area/le−12). The component s1 is the inline component and is connected to the three nodes (c1, b1, e1) and the terminal (s) and is of a model of the type mod1. In the above example, the inline subcircuit is identified by the tag "INLINE SUBCKT." This is merely one possible identifier. In addition, in the above example, the inline component is denoted or tagged by giving it the same name as the identifier following the inline subcircuit tag, e.g., "s1." Many other types of tags and component identifiers can be used without departing from the present invention.

When a designer simulates a circuit having an inline subcircuit according to the present invention, the designer can simply place the inline subcircuit in the design, e.g., in the second hierarchical level of the design, and can request information from a lower level of the design, e.g., the first hierarchical level, without having to identify every level. In the example set forth above, a designer wanting to know the voltage across the base-emitter junctions during a simulation need not identify the hierarchical level at which the design is based. Instead the designer need only request that the simulator save the requested parameter, e.g., Vbe, directly. For example, if the designer places an instance x1 of the inline subcircuit type s2 in the second level of a two-level design then the requested parameter, Vbe, can be saved using the following command, for example:

save x1:vbe where x1 represents the specially tagged inline component rather than the enclosing subcircuit.

Without the use of inline subcircuits the designer would need to know the detailed design at the hierarchical level having the parasitic elements (the first hierarchical level in this example) and make the following request:

save x1.s1:vbe where x1 represents the name of the subcircuit instance, and s1 represents the name of the actual device whose Vbe parameter is requested.

The present invention enables a designer to focus on high level design, e.g., the geometrical parameter level, and to ignore the detailed modeling issues since they can be modeled automatically in the inline subcircuits without the designer needing to know each component that is present in each level of the hierarchy.

Inline subcircuits can also be nested. For example the transistor and parasitic elements of FIG. 5 can be modeled using two levels of hierarchy. For example, the first level can include only the transistor and the model and the second level can include the parasitic elements as demonstrated in Examples (2) and (3), respectively.

```
INLINE SUBCKT bjtmod (c b e s)
parameters le=1u we=2u area=le*we
   model mod1 bjt type=npn bf=100+(le+we)/2*(area/le-
      12)
+ is=le-12*(le/we)*(area/le-12)
bjtmod (c b e s) mod1
ENDS bjtmod
```

EXAMPLE (2)

After defining the transistor and model subcircuit, bjtmod, where "is" is the saturation current, a second inline subcircuit can be defined "bjtpar" that includes both the bjtmod subcircuit and the parasitic elements that scale with geometry of the transistor as demonstrated in Example (3).

```
INLINE SUBCKT bjtpar (c b e s)
parameters le=1u we=2u area=le*we
bjtpar (c1 b1 e1 s) bjtmod // nested inline subckt rc c c1 resistor r=10*area*1e13
rb b b1 resistor r=20*area*1e11
re e e1 resistor r=25+area*1e12
ENDS bjtpar
```

EXAMPLE (3)

where "//" represents the beginning of a comment as in the C++ programming language. The designer can create an instance of an inline-within-an-inline subcircuit by inputting:

q1 vdd vdd 0 0 bjtpar // instantiate a bjt with parastics

The user can save data, e.g., the emitter current (e), regarding the transistor in the first hierarchical level during the simulation using the following command (for example):

save q1:e

In contrast, without the use of inline subcircuits and, instead, merely using conventional subcircuits the designer would need to identify each level of hierarchy between the main designing level, e.g., level 3, and the base level, e.g., level 1. For example, if the designer used a transistor in the first level (s1) a conventional subcircuit in the second level (q1) and another conventional subcircuit in the third level (q2) then the designer would need to request data using a command similar to:

save q2.q1.s1:e where each "." represents a layer of hierarchy that must be accounted for in the command. By using inline subcircuits instead the required command would be:

save q2:e with the intermediate layers of hierarchy removed.

Another benefit of using inline subcircuits in a circuit design is that a component can be modeled using different parameters. For example, when modeling bipolar junction transistors (BJTs), the current gain (bf) and the saturation current (is) are among the typical parameters used by the simulator. The present invention enables the designer to model components, e.g., a BJT, differently by instead specifying different parameters in order to model the effects of geometry or processing variations (for example) on the component. For example, instead of receiving current gain and saturation current parameters, an inline subcircuit can be used to parameterize the BJT model based upon variations in the length and width. For example, in Example (4), the width and length are passed to the inline subcircuit as parameters. The designer can consider the inline subcircuit as a typical transistor model but the inline subcircuit presents the designer with different parameters without the designer needing to know about the details, (for example simulator parameters, "is" and "bf") in the hierarchical level in which the detailed modeling is performed.

```
INLINE SUBCKT bjtmod(c b e s)
parameters le, we, area=le*we
   model mod1 bjt type=npn bf=100+(le+we)/2*(area/le-
      12)
+ is=le-12*(le/we)*(area/le-12)
bjtmod(c b e s) mod1
ENDS bjtmod
```

EXAMPLE (4)

As indicated above, one use of parameters is to pass the geometry of devices that are internal to the subcircuit as parameters. These geometric parameters are then used in various modeling equations within the subcircuit, for example, to create a process and geometry dependent model for a bipolar transistor device. The above example illustrates how the present invention enables the designer to pass parameters using inline subcircuits for the device being modeled without introducing additional hierarchical levels that need to be accounted for by the designer. It will be apparent that such parameters can be used to model effects and quantities other than geometry without departing from the scope of the present invention, e.g., temperature scaling or modeling effects such as transistor layouts in series or parallel.

Inline subcircuits can also be defined such that they have parameter and terminal interfaces that are similar to or that match primitive devices and components of other simulators. This makes maintenance of model libraries for different simulators an easier task. For example, if one simulator has a BJT model that only has three terminals (c, b, and e) in the terminal interface and does not have a substrate terminal, an inline subcircuit can be defined that includes only these three terminals without the designer needing to know about the details in the level of the hierarchy in which the detailed modeling of the component is performed. This is demonstrated in Example (5).

```
INLINE SUBCKT bjtmod(c b e)
parameters le=1u we=2u area=le*we
   model mod1 bjt type=npn bf=100+(le+we)/2*(area/le-
      12)
+ is=le-12*(le/we)*(area/le-12)
bjtmod(c b e gnd) mod1
ENDS bjtmod
```

EXAMPLE (5)

Using this inline subcircuit the designer would utilize the BJT model (bjtmod) as if it had only three terminals in the terminal interface and would not need to know that the substrate is modeled by shorting it to ground in another hierarchical level. Similarly, it is possible to use a parameterized inline subcircuit to change the parameters presented to the user.

In addition to using inline subcircuits for compatibility purposes, it is possible to design inline subcircuits to act as a "wrapper" around a primitive element to change its interface, without the designer needing to know about the details in the level of the hierarchy in which the primitive element is modeled. For example, in examples (4) and (5) an inline subcircuit was designed as a "wrapper" around a BJT primitive. In example (4) additional parameters were included in the parameter interface (we and le). In example (5) the substrate terminal (s) was removed from the terminal interface.

As can be seen from the previous examples, inline subcircuits permit modeling details to be hidden in a lower level of the design hierarchy without the user having to account for the additional layer during simulation, for example. The above examples describe how modeling parameters and effects, e.g., parasitic resistances, can be hidden from the designer by inline subcircuits. Other devices, for example, monitoring devices, can also be included and hidden from the designer. For example, a monitoring device can be modeled in an inline subcircuit such that if the current flow in the modeled device (inline component) reaches a defined limit during the simulation of the circuit the monitoring device notifies the designer/simulator that the current exceeded acceptable parameters. By placing the monitoring devices inside an inline subcircuit with the modeled device the designer need not know that the monitored parameters, e.g., operating current, are being modeled and does not need to work with an extra layer of hierarchy since the inline subcircuit eliminates this extra layer from the perspective of the designer and only exposed the modeled device (inline component). Instead, the designer can concentrate on the functional aspects of the circuit design and address the hidden monitored parameters only if and when a problem arises.

Inline subcircuits also enable general purpose model binning with an automatic model selection based upon design or simulation parameters when the inline subcircuit is used in conjunction with conditional instatiation of devices. Binning can be achieved using the value of any subcircuit parameter or combination of parameters without the designer experiencing any additional level of hierarchy.

In example (6) bipolar junction transistors are modeled using binning based upon the area of the transistor. This enables the transistor modeling to be more accurate because different characteristics can be modeled separately based upon the area range of the transistor, that is which "bin" it is in. In example (6), the saturation current (is) and the forward early voltage (vaf) of a transistor varies with the geometric size of the transistor. In this example, three modeling bins (or ranges) are defined, one for a default transistor (npn_default), another for a transistor having a width and length of less than 10 microns each (npn10x10) and another for a transistor having a width and length of less than 20 microns each (npn20x20). Each bin or range refers to a different model (npn_default, npn10x10, and npn20x20, respectively). One of the three transistor bin models are selected to model the characteristics of a particular transistor instance based upon the area of that transistor instance.

```
model npn_default bjt is=3.2e-16 vaf=59.8
model npn10x10 bjt is=3.5e-16 vaf=61.5
model npn20x20 bjt is=3.77e-16 vaf=60.5
```

```
INLINE SUBCKT npn_mod (c b e s)
parameters area=5e-12
if ( area < 100e-12 ) {              // bin1 10u * 10u
    npn_mod (c b e s) npn10x10
} else if ( area < 400e-12 ) {       // bin2 20u * 20 u
    npn_mod (c b e s) npn20x20
} else {                             // bin3
    npn_mod (c b e s) npn_default
}
ENDS npn_mod
```

EXAMPLE (6)

where "5e–12" represent 5 multiplied by 10 to the power of –12.

The designer can define various transistors (q1, q2, and q3) having different areas as demonstrated in example (7).

```
q1 1 2 0 0 npn_mod area=350e-12      // bin2: 20x20
q2 1 3 0 0 npn_mod area=25e-12       // bin1: 10x10
q3 1 3 0 0 npn_mod area=1000e-12     // bin3: default
```

EXAMPLE (7)

In example (7) the transistor instance q1 will have the characteristics of the transistor model in bin 2 (20×20), the transistor instance q2 will have the characteristics of the transistor model in bin 1 (10×10), the transistor instance q3 will have the characteristics of the transistor model in bin 3 (default).

As indicated above, binning can be accomplished using inline subcircuits using any inline subcircuit parameter or combination of parameters. It can also be achieved using global simulator parameters such as temperature. In example (8) the saturation current (is) and the forward early voltage (vaf) are modeled differently depending upon the circuit temperature. In this example "temp" is a circuit-simulator variable representing the value of the circuit or environment temperature. The user can set this value before the simulation begins and/or the temperature value can be changed during the simulation as the circuit temperature varies. A different transistor model is chosen by the simulator depending on the temperature because the behavior of transistors vary depending upon the temperature. In example (8), three temperature bins are defined (it will be apparent that any number of bins can be defined). One bin is selected when the temperature is below zero degrees centigrade. When this bin is selected the transistor model used is npn_cold. A second bin is selected when the temperature is between zero degrees and fifty degrees centigrade. When this bin is selected the transistor model used is npn_warm. A third bin is selected when the temperature is above fifty degrees centigrade. When this bin is selected the transistor model used is npn_hot.

```
INLINE SUBCKT npn_mod (c b e s)   // binning based on temp
if ( temp < 0 ) {                  // cold model
    npn_mod (c b e s) npn_cold
} else if ( temp < 50 ) {          // warm model
    npn_mod (c b e s) npn_warm
} else {                           // hot model
    npn_mod (c b e s) npn_hot
}
END npn_mod
model npn_cold bjt is=3.3e-16 va=54.8    // cold model
model npn_warm bjt is=3.4e-16 va=63.5    // warm model
model npn_hot bjt is=3.76e-16 va=67.5    // hot model
q1 1 2 0 0 npn_mod                 // create transistor instance
save q1                            // save transistor values (no hierarchy)
```

EXAMPLE (8)

The inline subcircuit enables the temperature modeling to be performed by a modeling engineer who can write the inline subcircuit which is then used by the design engineer who need not be knowledgeable of the details and who does not need to account for any additional levels of hierarchy.

In most simulation programs, e.g., SPICE and derivatives thereof, decreasing the number of models, e.g., transistor models, increases the efficiency of the simulator in terms of both speed and memory usage. Accordingly, one purpose of the present invention is to enable the designer to minimize the number of models that need to be defined. Conventional subcircuits allow a designer to define a transistor and a parameterized model together within the same subcircuit, where the model parameters are functions of the subcircuit parameters, see examples (2), (4), and (5), described above. However, each time the transistor is used in the circuit design (each subcircuit instance) another model needs to be created and stored. In addition, parameterized models that are defined within conventional subcircuits are not accessible to higher levels of the design hierarchy. The present invention overcomes these restrictions by enabling a designer to create an inline subcircuit for a model in a first hierarchical level in which this inline subcircuit can be used in another (higher) level of the hierarchy. In example (9), the inline subcircuit defines a BJT model called "s1".

INLINE SUBCKT s1
parameters we le area
model s1 bjt bf=100+(le+we)/2*(area/le-12)
+ is=le-12*(le/we)*(area/le-12)
ENDS

EXAMPLE (9)

The model in example (9) models a bjt transistor and some of its characteristics such as its saturation current (is) and current gain (bf) and how these characteristics scale with geometry. It will be apparent that many other characteristics can also be modeled using inline subcircuits and that other types of scaling or transformation (not limited to geometry) can occur. The inline subcircuit of Example (9) is at a first hierarchical level, e.g., level 2.

Additional models can be created in a higher hierarchical level, e.g., level 3, that use the hierarchy flattening attribute of the inline subcircuit to create additional models that do not need to define the parameterized model in detail, instead these additional models can merely reference the detailed model in the inline subcircuit and can specify some parameter values. Example (10) illustrates how three models are created and scaled for particular geometries of a transistor, by referencing and instantiating the subcircuit in example (9). Based upon the geometry, a small, medium, and large model are created.

small_mod s1 we=0.1 le=0.1 medium_mod s1 we=1.0 le=1.0 large_mod s1 we=10.0 le=10.0

EXAMPLE (10)

A designer can then create many (e.g., thousands) device instances which refer to the higher level models (small_mod, medium_mod, and large_mod) but the simulator executes significantly faster when compared to the use of conventional subcircuits. This is because only three actual models are created and stored when using inline subcircuits, as opposed to creating and storing one model per instance (of which there may be many) as with conventional subcircuits. One benefit of the present invention is that it enables a parameterized model to be defined as an inline subcircuit and it can be exported to other hierarchical levels outside of the inline subcircuit in which it is defined without requiring another layer of hierarchy in the model name. Another benefit of the present invention is that each parameterized model can be shared by a large number of device/subcircuit instances without requiring a new model to be stored for each instance.

For example, exported parameterized models can be shared by multiple device instances which themselves are not within the inline subcircuit. In this way a number of instances can share a single parameterized model (such as "small-mod", as defined in example (10)) in order to reduce memory requirements and to increase execution speed of the simulator.

Another problem with conventional circuit simulators is that these simulators have a fixed set of predefined outputs such as operating points, for the devices that are built into the simulator. These operating points are extra output properties of a device which may be of interest to the designer, and can be computed by the simulator. For example, each simulator has a predefined set of operating points (predefined by the vendor) such as a common emitter transconductance "gm" output parameter for a bipolar device. Access to the operating point when using a conventional subcircuit definition is hampered by the additional hierarchy that is introduced. This is not a problem for inline subcircuits however, which effectively removes the additional hierarchy. In addition to providing easy access to predefined output quantities such as operating points, it would be useful for the designer to be able to access quantities other that the predefined output parameters or operating points provided by the simulator. A second embodiment, which may be an extension of the first embodiment, for example, enables the designer to define the operating points of a subcircuit directly in the definition by including a definition of an output parameter in a subcircuit or inline subcircuit. This second embodiment can be used to augment and/or redefine existing output parameters.

For example, one definition of a circuit having one MOSFET (m1) and one parasitic resistor (rs) using conventional subcircuits is set forth in example (11).

```
SUBCKT parasitic_nmos (d g s b)
parameters l w
m1 (d g s1 b) mosmod l=l w=w        // inline device
rs (s1 s) r=1.56                     // 1.56 ohm parasitic resistor
ENDS parasitic_nmos
```

EXAMPLE (11)

Where "d" is the drain terminal, "g" is the gate terminal, "s" is the source terminal, and "b" is the bulk terminal of a MOSFET transistor. "rs" is the parasitic source resistor, and "r" is the resistance value of this resistor.

According to this embodiment of the present invention an output parameter is included in the definition of a subcircuit. In example (12) example (11) is rewritten as an inline subcircuit and arbitrary keywords "oppoint parameters" are used to identify output parameters.

INLINE SUBCKT m1 (d g s b)
parameters l w
oppoint parameters gm=1/(1/m1:gm+rs:res)*(l+w)/temp
m1(d g s1 b) mosmod l=l w=w // inline device
rs(s1 s) r=1.56
ENDS m1

EXAMPLE (12)

where "res" is the operating point resistance value of the source resistor. In example (12) the inline subcircuit has one output parameter "gm" that is user-defined to be dependent upon the predefined output gm of the m1 MOSFET device, and the predefined output resistance (res) of the parasitic source resistor (rs), and the subcircuit parameters (l, w) and the circuit temperature (temp) which is a global simulator variable. It will be apparent that the actual syntax used to denote the gm and res of devices m1 and rs respectively can be changed without departing from the present invention. It will also be apparent that the syntax used to represent the subcircuit parameters (l and w in this example) and global circuit parameters such as the temperature (temp) can be changed without departing from the present invention. If a user creates an instance (q1) of the inline subcircuit m1 as in example (13) using this embodiment the user can save the value of the user-defined oppoint parameter "gm" (as defined in the subcircuit m1), by specifying a save statement such as:

save q1:gm

```
q1 1 2 3 4 m1 l=5u w=10u    // create instance of inline
                             // subcircuit, m1
```

EXAMPLE (13)

One advantage of this embodiment is that the model that is used for a device can be changed from a built-in model to a user defined subcircuit model without the need to change the display setup in the CAD environment for the simulation result. The designer can create the new subcircuit model to behave like the built-in model.

As indicated above, the present invention enables output parameters to be added to otherwise conventional subcircuits, in addition to inline subcircuits.

Another advantage is that the designer can define output parameter or operating point information using algebraic expressions involving predefined operating points of components in the subcircuit, subcircuit input parameters, global simulator parameters such as temperature, or other information available from the simulator, for example. In addition, where nested subcircuits or inline subcircuits are used, the user-defined output parameters for an inner subcircuit definition can also be combined in the algebraic expressions for the outer subcircuit output parameters.

This embodiment of the present invention also enables the designer to define new operating point information. New oppoint parameters can be specified that are not currently calculated by the simulator.

This embodiment of the present invention also enables the designer to override predefined operating points by placing a device of the model in the subcircuit and redefining the operating point by specifying an output parameter in the subcircuit, as shown by parameter gm in example (12).

This embodiment of the present invention also enables the designer to enhance monitoring of the circuit by augmenting an existing subcircuit with output parameters to monitor circuit saturation or temperature, for example.

This embodiment enables device outputs of a simulator to be made compatible with device outputs of other simulators by modifying outputs as described above.

While the invention has been particularly shown and described with reference to a preferred embodiment and several alternate embodiments, it will be understood by persons skilled in the relevant art that various changes in form and details can be made therein without departing from the spirit and scope of the invention.

What is claimed is:

1. A method for creating a circuit design, said circuit design having a plurality of component representations comprising the steps of:
   placing a first inline subcircuit at a first hierarchical level in the circuit design, said first inline subcircuit having first and second components at a second hierarchical level; and
   defining said first component as an inline component such that said inline component is addressable directly from said first hierarchical level without reference to said second hierarchical level.

2. The method of claim 1, further comprising the step of:
   simulating said circuit design; and
   storing parameters of said first component during said simulation using a storing command, wherein one or more hierarchical identifiers of said first component parameters are not referenced in said storing command.

3. The method of claim 1, further comprising the step of:
   placing a second inline subcircuit at a third hierarchical level in the circuit design, said second inline subcircuit having said first inline subcircuit as an inline component;
   wherein said first component is addressable directly from said third hierarchical level without reference to said first and second hierarchical level.

4. The method of claim 3, further comprising the step of:
   simulating said circuit design; and
   storing parameters of said first component during said simulation using a storing command, wherein two or more hierarchical identifiers of said parameters of said first component are not referenced in said storing command.

5. The method of claim 1, wherein said second component is a parasitic component associated with said first component.

6. The method of claim 1, wherein said first inline subcircuit includes a first set of explicit-component parameters relating to the operation of said first component that are different from a second set of parasitic-component parameters that is included in a definition of said first component.

7. The method of claim 6, wherein a first parameter interface for said first component includes said first set of parameters for said first component, said first parameter interface at said first hierarchical level; and wherein a second parameter interface for said first component includes said second set of parameters for said first component, said second parameter interface at said second hierarchical level.

8. The method of claim 7, wherein said first parameter interface is compatible with another parameter interface for a third component in a first simulator.

9. The method of claim 1, wherein said first inline subcircuit includes a first set of terminals relating to the explicit terminals of said first component that are different from a second set of terminals relating to parasitic elements that is included in a definition of said first component.

10. The method of claim 9, wherein a first terminal interface for said first component includes said first set of terminals for said first component, said first terminal interface at said first hierarchical level; and wherein a second terminal interface for said first component includes said second set of terminals for said first component, said second terminal interface at said second hierarchical level.

11. The method of claim 10, wherein said first terminal interface is compatible with another terminal interface for a third component in a first simulator.

12. The method of claim 1, wherein said second component models a first function that is hidden at said first hierarchical level.

13. The method of claim 12, wherein said first function is a circuit monitoring function.

14. The method of claim 1, wherein a second inline subcircuit at said first hierarchical level includes third and fourth components at said second hierarchical level, said first and third components representing a first and second models having a first parameter, further comprising the steps of:

automatically placing one of said first inline subcircuit and said second inline subcircuit in said first hierarchical level based upon the value of said first parameter in said second hierarchical level.

15. The method of claim 1, further comprising the step of:

placing a first instance in said first hierarchical level, said first instance referencing said first component, wherein said first component is a parameterized model.

16. The method of claim 1, wherein said first component is a parameterized model and includes a first parameter, the method further comprising the step of:

placing a first instance in said first hierarchical level, said first instance referencing said first parameter that is located in said second hierarchical level.

17. The method of claim 1, wherein said first component includes a first set of output parameters, the method further comprising the step of:

altering the first set of output parameters to form a second set of output parameters for said first component.

18. The method of claim 17, further comprising the step of: placing a first instance in said first hierarchical level, said first instance referencing said second set of output parameters that are located in said second hierarchical level.

19. A data structure, located in a storage device, generated by the method of claim 1.

20. A computer program stored in a computer readable medium and capable of being read by a computer for performing the method of claim 1.

21. A system for creating a circuit design, said circuit design having a plurality of component representations comprising:

placing means for placing a first inline subcircuit at a first hierarchical level in the circuit design, said first inline subcircuit having a first and second component at a second hierarchical level; and identifying means, disposed to receive signals from said placing means, for identifying said first component as an inline component such that said inline component is addressable directly from said first hierarchical level without reference to said second hierarchical level.

22. The system of claim 21, further comprising:

simulation means, disposed to receive signals from said placing means, simulating said circuit design; and storing means, disposed to receive signals from said simulation means, for storing parameters of said first component during said simulation using a storing command, wherein one or more hierarchical identifiers of said first component parameters are not referenced in said storing command.

23. The system of claim 21, wherein said second component is a parasitic component associated with said first component.

24. The system of claim 21, wherein said first inline subcircuit includes a first set of parameters relating to the operation of said first component that are different from a second set of parameters that is included in a definition of said first component.

25. The system of claim 24, wherein a first parameter interface for said first component includes said first set of parameters for said first component, said first parameter interface at said first hierarchical level; and wherein a second parameter interface for said first component includes said second set of parameters for said first component, said second parameter interface at said second hierarchical level.

26. The system of claim 25, wherein said first parameter interface is compatible with another parameter interface for a third component in a first simulator.

27. The system of claim 1, wherein said first inline subcircuit includes a first set of terminals relating to the terminals of said first component that are different from a second set of terminals that is included in a definition of said first component.

28. The system of claim 27, wherein a first terminal interface for said first component includes said first set of terminals for said first component, said first terminal interface at said first hierarchical level; and wherein a second terminal interface for said first component includes said second set of terminals for said first component, said second terminal interface at said second hierarchical level.

29. The system of claim 28, wherein said first terminal interface is compatible with another terminal interface for a third component in a first simulator.

30. The system of claim 21, wherein said second component models a first function that is hidden at said first hierarchical level.

31. The system of claim 30, wherein said first function is a circuit monitoring function.

32. The system of claim 21, wherein a second inline subcircuit at said first hierarchical level includes third and fourth components at said second hierarchical level, said first and third components representing a first and second models having a first parameter, further comprising:
  placing means, for automatically placing one of said first inline subcircuit and said second inline subcircuit in said first hierarchical level based upon the value of said first parameter in said second hierarchical level.

33. The system of claim 21, wherein said placing means places a first instance in said first hierarchical level, said first instance referencing said first component, wherein said first component is a parameterized model.

34. The system of claim 21, wherein said first component is a parameterized model and includes a first parameter, wherein said placing means places a first instance in said first hierarchical level, said first instance referencing said first parameter that is located in said second hierarchical level.

35. The system of claim 21, wherein said first component includes a first set of output parameters, further comprising:
  altering means, for altering the first set of output parameters to form a second set of output parameters for said first component.

36. The system of claim 35, wherein said placing means places a first instance in said first hierarchical level, said first instance referencing said second set of output parameters that are located in said second hierarchical level.

37. A method of simulating a circuit, comprising the steps of:
  defining a first component to generate a first component definition;
  defining a second component to generate a second component definition, by, at least in part, referring to said first component definition thereby incorporating said first component definition in said second component definition;
  said first and second steps of defining including, respectively, naming said first and second components to define first and second names;
  at least one of said first and second steps of defining including permitting said first component to be referred to by the name of said second component, whereby said first component may be referred in a simulation by said second name without reference to said first name.

38. A method for simulating circuit designs, comprising the steps of:
  defining a first circuit;
  defining a second circuit;
  said second step of defining including referring to a definition resulting from said first step of defining such that a hierarchical definition of said second circuit results from said second step of defining;
  referring to a value relating to said first circuit by referring only to a definition resulting from said second step of defining, whereby a value relating to a circuit is referenced while maintaining a hierarchical structure of definitions of said first and second circuits.

39. A computer program stored in a computer readable medium capable of being read by a computer and effective to perform the method of claim 38.

40. A method for simulating circuit designs, comprising the steps of:
  defining first circuits;
  defining second circuits;
  said second step of defining including referring to definitions resulting from said first step of defining such that a hierarchical definition of said second circuit is made by said second step of defining;
  defining a third circuit or simulating a performance of said second circuit by referring to said first circuit or a parameter thereof by referring only to a definition resulting from said second step of defining without referring to a definition resulting from said first step of defining.

41. A method as in claim 40, wherein said step of referring includes identifying said definition resulting from said second circuit by an identifier of said second circuit.

42. A computer program stored in a computer readable medium capable of being read by a computer and effective to perform the method of claim 41.

43. A computer program stored in a computer readable medium capable of being read by a computer and effective to perform the method of claim 40.

44. A simulation program for simulating circuit designs, comprising:
  a set of tools for defining circuits by building modular subcomponents in building-block fashion into larger components;
  a naming convention for identifying, for analysis or interconnection, a feature of a given subcomponent incorporated in a component by identifying the feature by its name, naming the subcomponent of which it is a part, and naming the component of which the subcomponent is a part;
  a special naming convention for identifying features of special components by defining a component as an inline component and permitting the identification of features of a subcomponent incorporated in said inline component by reference only to the name of the inline component and the feature without naming the subcomponent of which it is a part.

45. A method for defining a component and identifying a feature thereof, in a simulation program used for simulating circuit designs, the simulation program being of a type in which components may be defined in a hierarchical fashion and the conventional method of identifying a particular feature of a particular component is by identifying all parent components of the hierarchy to which the particular component belongs and the particular feature of the particular component, comprising the steps of:
  defining a selected component as a special type of component;
  said step of defining including identifying another component having a selected feature;
  said step of defining including converting data in a simulation program such that that any identification of said selected feature plus a reference to said selected component is identified by said simulation program as a reference to said feature of said another component, whereby said selected feature may be accessed as if said selected component had the properties of said another component and a need to explicitly reference a hierarchical structure is avoided.

46. A simulation program capable of implementing the steps of the method of claim 45.

47. A computer readable medium with the simulation program of claim 45 encoded thereon.

* * * * *

UNITED STATES PATENT AND TRADEMARK OFFICE
CERTIFICATE OF CORRECTION

PATENT NO.    : 6,381,563 B1
DATED         : April 30, 2002
INVENTOR(S)   : Donald J O'Riordan, Walter J. Ghijsen and Kenneth S. Kundert It is certified that error appears in the above-identified patent and that said Letters Patent is hereby corrected as shown below:

Title page,
Item [56], OTHER PUBLICATIONS, immediately after "Chakrabarti et al.,", please replace "An Improved Test Generation Technique for Combinations Circuits with Repetavie Sub-Circuits" with -- An Improved Test Generation Technique for Combinations Circuits with Repetitive Sub-Circuits --.

Column 18,
Line 54, please replace "that that" with -- that --.

Signed and Sealed this

Eighteenth Day of November, 2003

JAMES E. ROGAN
*Director of the United States Patent and Trademark Office*